United States Patent
Chang et al.

(10) Patent No.: US 6,193,804 B1
(45) Date of Patent: Feb. 27, 2001

(54) APPARATUS AND METHOD FOR SEALING A VACUUM CHAMBER

(75) Inventors: Hao-Wei Chang; Jen-Shang Fang; Ching-Kun Hung, all of Hsin-chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/411,717

(22) Filed: Oct. 2, 1999

(51) Int. Cl.[7] .................................................. C23C 14/00
(52) U.S. Cl. ............................ 118/733; 118/715; 220/315
(58) Field of Search ...................................... 118/715, 733; 220/315

(56) References Cited

U.S. PATENT DOCUMENTS 3,915,117 * 10/1975 Schertler ........................... 118/733
4,169,538 * 10/1979 Bird .................................... 220/329
4,641,603 * 2/1987 Miyazaki ............................ 118/733

* cited by examiner

Primary Examiner—Richard Bueker
(74) Attorney, Agent, or Firm—Tung & Associates

(57) ABSTRACT

An apparatus and a method for sealingly engaging an upper chamber lid and a lower chamber lid of a vacuum process chamber together without leakage are provided. In the apparatus, an upper chamber lid is connected to a support frame by an universal joint such that a perfect alignment between the upper chamber lid and the lower camber lid can be achieved by making 360° movement of the upper chamber lid. The support frame is further provided with a plurality of compressible spring members, i.e., at least 3 or 4 spring members that are mounted to the support frame and projected downwardly for pressing on a top surface of the upper camber lid and achieving a vacuum-tight seal between the upper lid and the lower lid. The novel use of the universal joint and the plurality of compressible springs therefore enables the present invention apparatus to achieve a vacuum-tight seal between two chambers halves in a vacuum process chamber.

20 Claims, 2 Drawing Sheets

APPARATUS AND METHOD FOR SEALING A VACUUM CHAMBER

FIELD OF THE INVENTION

The present invention generally relates to an apparatus and a method for sealing a vacuum chamber and more particularly, relates to an apparatus and a method for sealingly engaging an upper chamber lid to a lower chamber lid of a vacuum process chamber by using a support frame for mounting the upper chamber lid thereto through a universal joint connecting between the support frame and the center of the upper chamber lid such that the upper and the lower chamber lids are intimately engaged together and four compressible springs mounted on the support frame for applying compressive pressure on the upper chamber lid for achieving a vacuum-tight seal.

BACKGROUND OF THE INVENTION

In the semiconductor device fabrication processes, vacuum process chambers are widely used for conducting various chemical or physical processes. For instance, vacuum process chambers are widely used in deposition processes such as chemical vapor deposition or physical vapor deposition; in coating processes such as a spin coating process for a photoresist material or a spin-on-glass material; and various other fabrication processes. In any of the processes, a vacuum chamber may be constructed of an upper chamber and a lower chamber, or an upper chamber lid and a lower chamber lid. The structure is designed to facilitate the loading and unloading of a semiconductor substrate into or out of a process chamber. For instance, in one of the common constructions for a vacuum process chamber, the lower chamber lid can be moved up and down while the upper chamber lid stays stationary with a substrate platform positioned in a cavity formed between the lower chamber lid and the upper chamber lid. A robot arm is used for reaching into the chamber cavity for the loading and unloading of substrates. After a substrate is properly seated on the substrate platform, the platform moves into its process position and the lower chamber lid closes onto the upper chamber lid to effect a vacuum-tight seal.

In the vacuum process chamber discussed above, the upper chamber lid is frequently fixedly attached to a support frame for the operation of the chamber. Since the support frame for the upper chamber lid is not always perfectly centered in relation to the lower chamber lid, the upper and the lower chamber lids are frequently not perfectly aligned. This results in leakage in the vacuum chamber and specifically, leakage around the edges of the chamber. For instance, in a spin coating apparatus for a photoresist material, it has been observed that during the coating of an adhesion promoter layer prior to the coating of the photoresist material, the process produces wafer edge defects in an area of approximately 8~20 mm wide around the wafer edge. The defects are caused by a leakage in the vacuum process chamber when ambient air leaks into the chamber and cause defect formation around the edge of the wafer. Typical defects formed are film coating pattern shift and film lifting.

An illustration for a conventional mounting method for a vacuum process chamber is shown in FIG. 1. The vacuum process chamber 10 consists of an upper chamber 14 and a lower chamber 16 used for the processing of a wafer 20 contained in a vacuum cavity formed when the upper chamber 14 and the lower chamber 16 are tightly closed together. The upper chamber 14 is rigidly and fixedly mounted by a mounting means 18 to a support frame 12 for mating with the lower chamber 16. It should be noted that the apparatus 10 is shown in FIG. 1 for illustration purpose only and in a much simplified manner. Since the upper chamber 14, or the upper chamber lid is rigidly and fixedly mounted to the support frame 12 through mounting means 18, a perfect alignment of the upper chamber 14 to the lower chamber 16 when the lower chamber 16 is moved up to close on the upper chamber 14 is extremely difficult. The rigid connection provided between the upper chamber 14 and the support frame 12 does not allow any lateral movement of the upper chamber 14 during the closing step for the upper and lower chambers.

It is therefore an object of the present invention to provide an apparatus for sealingly engaging an upper chamber lid and a lower chamber lid of a vacuum process chamber together that does not have the drawbacks or shortcomings of the conventional mounting apparatus.

It is another object of the present invention to provide an apparatus for sealingly engaging an upper chamber lid and a lower chamber lid of a vacuum process chamber together that permits lateral movement of the upper chamber lid relative to the lower chamber lid.

It is a further object of the present invention to provide an apparatus for sealingly engaging an upper chamber lid and a lower chamber lid of a vacuum process chamber together by mounting the upper chamber lid to a support frame via an universal joint device.

It is another further object of the present invention to provide an apparatus for sealingly engaging an upper chamber lid and a lower chamber lid of a vacuum process chamber together by utilizing a universal joint between the upper chamber lid and a support frame the lid is mounted and a plurality of compressible springs mounted on the support frame for exerting downward pressure on the upper chamber lid.

It is still another object of the present invention to provide an apparatus for sealingly engaging an upper chamber lid and a lower chamber lid of a vacuum process chamber together by utilizing a universal joint for lateral movement of the upper chamber lid and four compressible springs for achieving vacuum-tight seal.

It is yet another object of the present invention to provide a vacuum process chamber that includes a sealing means disposed between an upper chamber lid and a support member which includes a universal joint for allowing 360° movement of the lid and a plurality of compressible spring for effecting a seal between the upper chamber lid and a lower chamber lid.

It is still another further object of the present invention to provide a vacuum process chamber that utilizes a universal joint between an upper chamber lid and a support member for allowing lateral movement of the upper chamber lid and four compressible springs equally spaced from each other for exerting a downward pressure on the upper chamber lid effecting a vacuum-tight seal with a lower chamber lid.

It is yet another further object of the present invention to provide a method for sealingly engaging an upper chamber lid to a lower chamber lid forming a vacuum process chamber by attaching the upper chamber lid to a support frame via an universal joint and at least three compressible springs projected downwardly from the support member for exerting pressure on the upper chamber lid and effecting a vacuum-tight seal between the upper and lower chamber lids.

SUMMARY OF THE INVENTION

In accordance with the present invention, an apparatus and a method for sealing a vacuum process chamber are provided.

In a preferred embodiment, an apparatus for sealingly engaging an upper chamber lid and a lower chamber lid of a vacuum process chamber together is provided which includes an upper lid support frame adapted for mounting a top end of spaced-apart compressible spring members at four corners and a top end of a universal joint member at a center, an upper chamber lid which has a top surface adapted for contacting a bottom end of the spaced-apart compressible spring members at four corners and a bottom end of a universal joint member at a center, the upper chamber lid further includes a bottom surface adapted for sealingly engaging a top surface of the lower chamber lid, and a universal joint member connecting the upper chamber lid support frame and the top surface of the upper chamber lid for 360° movement of the upper chamber lid such that the bottom surface of the upper lid intimately engages the top surface of the lower chamber lid, whereby the compressible spring members mounted on the upper chamber lid support frame pushes the upper chamber lid onto the lower chamber lid effecting a vacuum-tight seal.

In the apparatus for sealingly engaging an upper chamber lid and a lower chamber lid of a vacuum process chamber, the upper chamber lid support frame includes two elongated members rigidly attached at a center of both members such that the two members are perpendicular to each other. The upper chamber lid support frame may further include three elongated members of a center member and two cross members rigidly attached together in a H-configuration. The bottom end of each of the compressible spring members may further include a spherical-shaped contact for exerting a compressive force on the top surface of the upper chamber lid. The apparatus may further include a gas inlet port mounted on the top surface of the upper chamber lid for connecting to the bottom end of the universal joint. The gas inlet port may include a vacuum inlet and a reactant gas inlet for the vacuum process chamber. The spherical-shaped contact may be fabricated of Teflon, or of any other pliable material. Each of the compressible spring members includes a helical spring mounted between the spherical-shaped contact and a spring mounting post.

The present invention is further directed to a vacuum process chamber which includes an upper chamber lid mounted to a support member, a lower chamber lid for sealingly engaging the upper chamber lid to form a vacuum cavity therein, and a sealing means disposed between the upper chamber lid and the support frame which includes a universal joint connecting the upper chamber lid to the support member for 360° movement of the upper chamber lid, and a plurality of compressible springs projecting from the support member toward the upper chamber lid for effecting a seal between the upper chamber lid and the lower chamber lid.

The vacuum process chamber may further include a gas withdrawing means. The chamber may further include a gas inlet port mounted on the upper chamber lid for connecting to the universal joint. The plurality of compressible springs presses downwardly on the upper chamber lid effecting a vacuum-tight seal with the lower chamber lid. The plurality of compressible springs may include at least three equally spaced springs, or four equally spaced springs. Each of the plurality of compressible springs may include a helical spring mounted between a spherical-shaped contact and a spring mounting post. The support member may include a center elongated member and two cross members rigidly mounted together in a H-configuration.

In an alternate embodiment, the method for sealingly engaging an upper chamber lid to a lower chamber lid to form a vacuum process chamber may be carried out by the steps of providing an upper chamber lid and a lower chamber lid, attaching the upper chamber lid to a support frame by a universal joint for 360° movement of the upper chamber lid such that an intimate engagement between the upper chamber lid and the lower chamber lid can be established, and pressing downwardly on the upper chamber lid by a plurality of compressible springs mounted on and projected downwardly from the support member toward the upper chamber lid effecting a vacuum-tight seal between the upper chamber lid and the lower chamber lid.

In the method for sealingly engaging an upper chamber lid to a lower chamber lid to form a vacuum process chamber, the method may further include the step of providing the support frame in a H-configuration by a center elongated member and two cross members rigidly attached together. The method may further include the step of providing four spaced-apart compressible springs projected downwardly from the support member toward the upper chamber lid effecting a vacuum-tight seal between the upper chamber lid and the lower chamber lid.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus for sealingly engaging an upper chamber lid and a lower chamber lid of a vacuum process chamber together to effect a vacuum-tight seal between the lids. The apparatus includes a flexible connection made between the upper chamber lid and a support frame by utilizing a universal joint which allows the upper chamber lid to move 360°. The apparatus further utilizes a plurality of compressible spring members that are mounted on the support frame and projected downwardly toward a top surface of the upper chamber lid for a vacuum-tight seal. The novel use of an universal joint and a plurality, i.e., at least 3 or 4, of compressible springs enables lateral movement of the upper chamber lid and thus a flexible mating with the lower chamber lid to establish an intimate engagement between the two lids. The use of the plurality of compressible springs further ensures that the upper lid is pressed tightly against the lower lid to effect a vacuum-tight seal. The plurality of compressible springs also serves the function of preventing the upper chamber lid from tilting and possibly causing a leak in the vacuum chamber.

Figure 1:
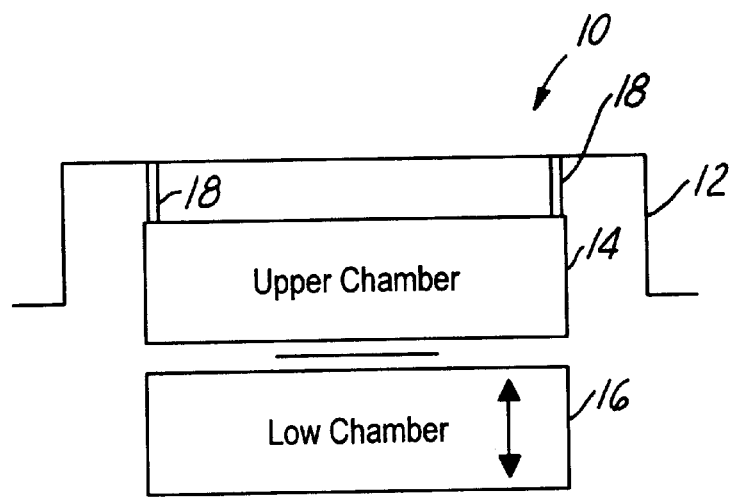
FIG. 1 is an illustration of a conventional vacuum process chamber having an upper chamber fixedly connected to a support frame.
Figure 2:
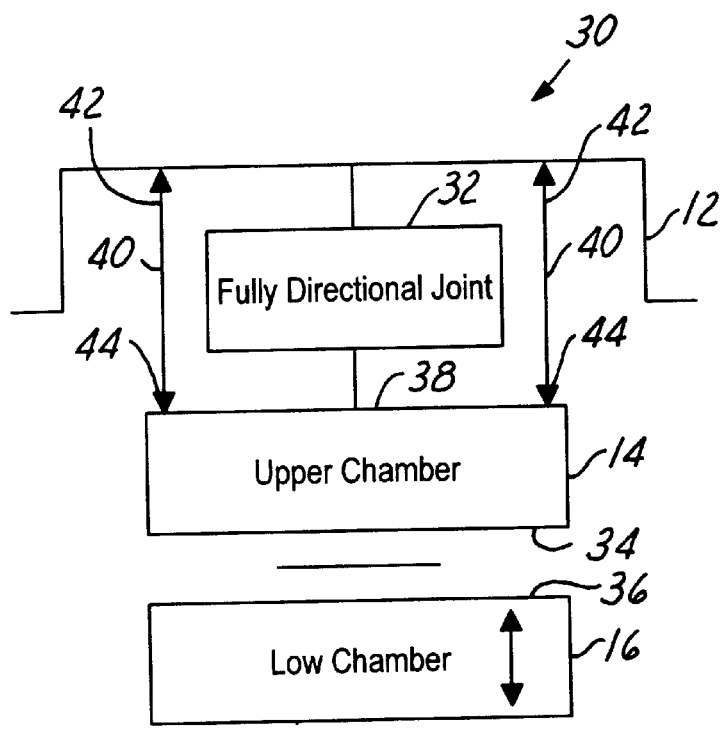
FIG. 2 is an illustration of a present invention vacuum process chamber with the upper chamber connected to a support frame through a universal joint and a plurality of compressible springs.

In a simplified illustration, the present invention apparatus 30 is shown in FIG. 2. It is seen that a support frame 12, an upper chamber lid 14 and a lower chamber lid 16 are provided. Instead of fixedly connecting the upper chamber lid 14 to the support frame 12, the present invention utilizes a flexible connection method by using a fully directional joint 32, i.e., an universal joint. The fully directional joint 32 allows the upper chamber lid 14 to move in all directions and thus to make adjustments in its position relative to the lower chamber lid 16, i.e., to establish an intimate engagement between a bottom surface 34 of the upper chamber lid 14 and a top surface 36 of the lower chamber lid 16. Only after an intimate engagement between the surfaces 34, 36 is achieved, a vacuum withdrawal process is initiated for the vacuum process chamber 30.

The present invention novel apparatus, as shown in FIG. 2, further utilizes a plurality of compressible spring members 40 that are spaced-apart from each other. The upper end 42 of the compressible spring 40 is fixed to the support frame 12, while the lower end 44 of the compressible spring 40 is provided a spherical-shaped contact which touches the top surface 38 of the upper chamber lid 14. By touching, it is meant the compressible spring 40 exerts a downward pressure on the top surface 38 of the upper chamber lid 14. The number of compressible springs 40 utilized may be suitably adjusted to suit each application. For instance, in a vacuum chamber of a circular cross-sectional shape, at least three, and preferably four compressible springs may be utilized. This is shown in FIGS. 3 and 4.

Figure 3:
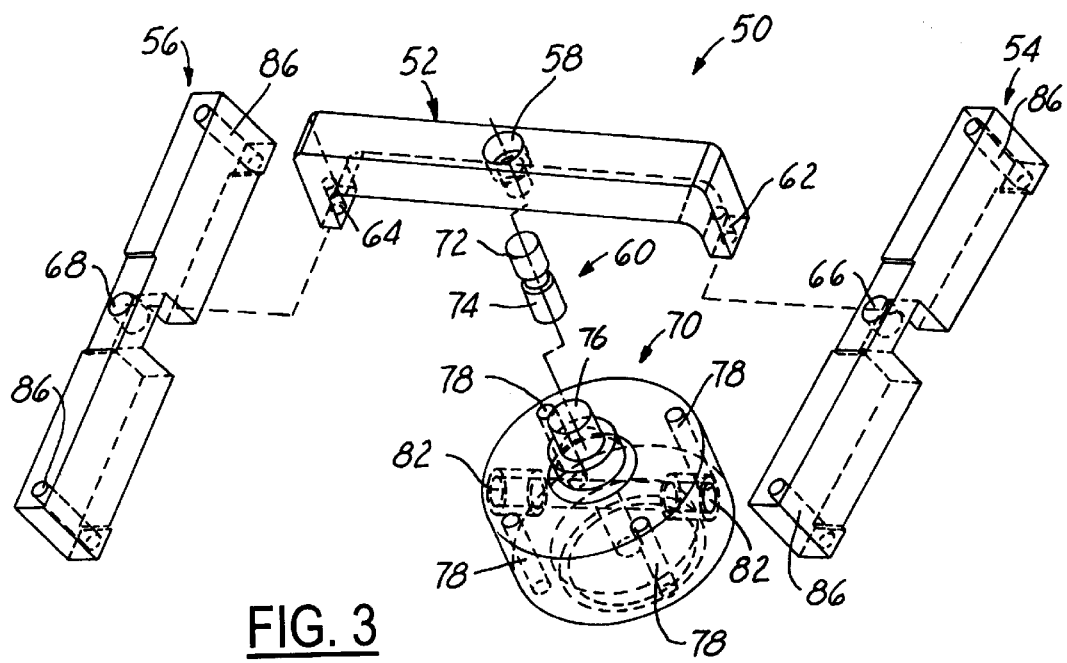
FIG. 3 is a perspective view of a present invention support frame incorporating a universal joint and a gas inlet port.

FIG. 3 shows a perspective, exploded view of the present invention support frame 50 equipped with an universal joint 60 and a gas inlet port 70. The support frame 50 includes three elongated members of a center member 52 and two cross members 54, 56 which are rigidly attached to the center member 52 in a H-configuration. It is seen that the center elongated member 52 is provided with a center aperture 58 for mounting the universal joint 60, and two mounting holes 62, 64 for attaching the cross members 54, 56 through mounting apertures 66, 68 by bolt s (not shown). After bolts are penetrated through apertures 66, 68 and threaded into mounting holes 62, 64, the H-configuration support frame 50 is rigidly constructed and ready for mounting an upper chamber lid (not shown) thereto through the universal joint 60 and the gas inlet port 70.

As shown in FIG. 3, the upper end 72 of the universal adapter 60 is attached to the mounting aperture 58, while the lower end 74 of the universal joint 60 is attached to a mounting boss 76 on the gas inlet port 70. The gas inlet port 70 is normally attached to the upper chamber lid 80 (shown in ghost line in FIG. 4). The gas inlet port 70 can be attached by conventional means such as by bolts (not shown). Also shown in FIG. 3, the gas inlet port 70 is constructed by a plurality of vacuum ports 78 and a reactant gas inlet port 82. The universal joint 60 allows the gas inlet port 70 to move in 360°, i.e., enables the upper chamber lid 80 to move in 360°.

Figure 4:
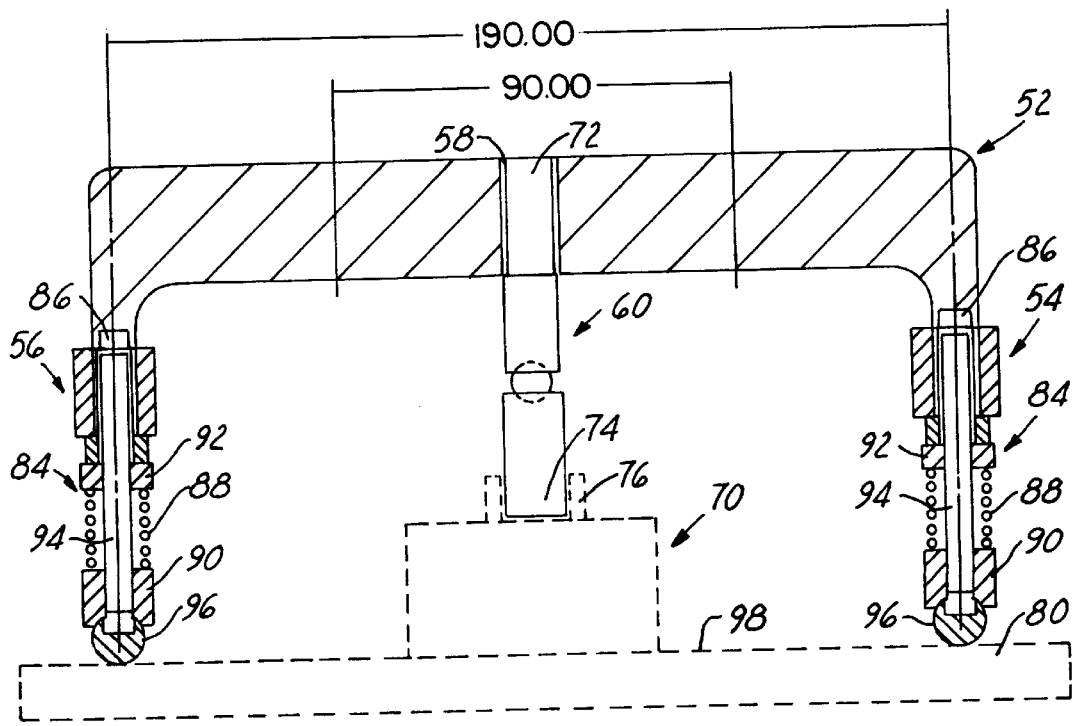
FIG. 4 is a cross-sectional view of the present invention support frame equipped with an universal joint and a plurality of compressible springs.

FIG. 4 is a cross-sectional view of a cross member 54 (or 56) with two compressible spring members 84 attached. The attachment of the compressible springs 84 is achieved through mounting apertures 86 provided in the center elongated member 52.

As shown in FIG. 4, each of the compressible spring members 84 is constructed by a helical spring 88 mounted between a slider 90 and a spring post 92 over a shaft 94. At the lower extremity of the compressible spring 84, a spherical-shaped contact 96 is provided for contacting a top surface 98 of the upper chamber lid 80. The contact 96 pushes down on the top surface 98 by the action of the helical springs 88 for achieving a vacuum-tight seal between the upper chamber lid and a lower chamber lid (not shown).

The novel features of the present invention apparatus for sealingly engaging an upper chamber lid and a lower chamber together are shown in FIGS. 3 and 4. The universal joint 60 is first used to allow the upper chamber lid 80 to make 360° movement such that the upper chamber lid 80 and a lower chamber lid (not shown) can be intimately mated without gaps and possible vacuum leaks. The universal joint 60 therefore allows a perfect alignment to be achieved between the two lids. The plurality of compressible members 84, on the other hand, provides downwardly applied forces on the top surface 98 of the upper chamber lid 80 such that a vacuum-tight seal between the upper chamber lid and the lower chamber lid can be achieved. The present invention novel sealing capability is therefore made possible by the novel use of a support frame 50, an universal joint 60, an upper chamber lid 80 and a plurality of compressible springs 84.

The present invention novel apparatus and a method for using the apparatus have therefore been amply described in the above descriptions and in the appended drawings of FIGS. 2, 3 and 4. While the present invention has been described in an illustrative manner, it should be understood that the terminology used is intended to be in a nature of words of description rather than of limitation.

Furthermore, while the present invention has been described in terms of a preferred and alternate embodiments, it is to be appreciated that those skilled in the art will readily apply these teachings to other possible variations of the inventions.

The embodiment of the invention in which an exclusive property or privilege is claimed are defined as follows:

1. An apparatus for sealingly engaging an upper and a lower chamber lid of a vacuum process chamber together comprising:

an upper lid support frame adapted for mounting top ends of spaced apart compressible spring members at four corners and a top end of a universal joint member at a center, an upper lid having a top surface adapted for contacting a bottom end of said spaced-apart compressible spring members at four corners and a bottom end of said universal joint member at a center, said upper lid further having a bottom surface adapted for sealingly engaging a top surface of said lower chamber lid, and a universal joint member connecting said upper lid support frame and said top surface of said upper lid for 360° movement of said upper lid such that said bottom surface of said upper lid intimately engages said top surface of said lower lid, whereby said compressible spring members mounted on said lid support frame pushes said upper lid onto said lower lid effecting a vacuum-tight seal.

2. An apparatus for sealingly engaging an upper lid and a lower lid of a vacuum process chamber together according to claim 1, wherein said upper lid support frame comprises two elongated members rigidly attached at a center of both members with the two members situated perpendicular to each other.

3. An apparatus for sealingly engaging an upper lid and a lower lid of a vacuum process chamber together according to claim 1, wherein said upper lid support frame comprises three elongated members of a center member and two cross members rigidly attached together in a H-configuration.

4. An apparatus for sealingly engaging an upper lid and a lower lid of a vacuum process chamber together according to claim 1, wherein said bottom end of each of said compressible spring members further comprises a spherical-shaped contact for exerting a compressible force on said top surface of said upper lid.

5. An apparatus for sealingly engaging an upper lid and a lower lid of a vacuum process chamber together according to claim 1 further comprising a gas inlet port mounted on said top surface of said upper lid for connecting to said bottom end of the universal joint.

6. An apparatus for sealingly engaging an upper lid and a lower lid of a vacuum process chamber together according to claim 5, wherein said gas inlet port comprises a vacuum inlet and a reactant gas inlet for said vacuum process chamber.

7. An apparatus for sealingly engaging an upper lid and a lower lid of a vacuum process chamber together according to claim 4, wherein said spherical-shaped contact being fabricated of Teflon.

8. An apparatus for sealingly engaging an upper lid and a lower lid of a vacuum process chamber together according to claim 4, wherein said spherical-shaped contact being fabricated of a pliable material.

9. An apparatus for sealingly engaging an upper lid and a lower lid of a vacuum process chamber together according to claim 4, wherein each of said compressible spring members comprises a helical spring mounted between said spherical-shaped contact a spring mounting post.

10. A vacuum process chamber comprising:

an upper chamber lid mounted to a support member, a lower chamber lid for sealingly engaging said upper lid forming a vacuum cavity therein, and a sealing means disposed between said upper chamber lid and said support member comprising:

a universal joint connecting said upper chamber lid to said support member for 360° movement of said upper chamber lid, and a plurality of compressible springs projecting from said support member toward said upper chamber lid for effecting a seal between said upper chamber lid and said lower camber lid.

11. A vacuum process chamber according to claim 10 further comprising vacuum withdrawing means.

12. A vacuum process chamber according to claim 10 further comprising a gas inlet port mounted on said upper chamber lid for connecting to said universal joint.

13. A vacuum process chamber according to claim 10, wherein said plurality of compressible springs presses downwardly on said upper chamber lid effecting a vacuum-tight seal with said lower chamber lid.

14. A vacuum process chamber according to claim 10, wherein said plurality of compressible springs comprises at least three equally spaced springs.

15. A vacuum process chamber according to claim 10, wherein said plurality of compressible springs comprises four equally spaced springs.

16. A vacuum process chamber according to claim 10, wherein each of said plurality of compressible springs comprises a helical spring mounted between a spherical-shaped contact and a spring mounting post.

17. A vacuum process chamber according to claim 10, wherein said support member comprises a center elongated member and two cross members rigidly attached in a H-configuration.

18. A method for sealingly engaging an upper chamber lid to a lower chamber lid forming a vacuum process chamber comprising the steps of:

providing an upper chamber lid and a lower chamber lid, attaching said upper chamber lid to a support frame by a universal joint for 360° movement of said upper chamber lid such that an intimate engagement between said upper chamber lid and said lower chamber lid is established, and pressing downwardly on said upper chamber lid by a plurality of compressible springs mounted on and projected from said support member toward said upper chamber lid effecting a vacuum-tight seal between said upper chamber lid and said lower chamber lid.

19. A method for sealingly engaging an upper chamber lid to a lower chamber lid forming a vacuum process chamber according to claim 18 further comprising the step of providing said support frame in a H-configuration by a center elongated member and two cross members rigidly attached together.

20. A method for sealingly engaging an upper chamber lid to a lower chamber lid forming a vacuum process chamber according to claim 18 further comprising the step of providing four spaced-apart compressible springs projecting from said support member toward said upper chamber lid effecting said vacuum-tight seal between said upper chamber lid and said lower chamber lid.

* * * * *